United States Patent
Moghaddam et al.

(10) Patent No.: US 7,215,545 B1
(45) Date of Patent: May 8, 2007

(54) LIQUID COOLED DIAMOND BEARING HEAT SINK

(76) Inventors: Saeed Moghaddam, 5308 Butler Ct., Columbia, MD (US) 21044; John Lawler, 12225 Quince Valley Dr., N. Potomac, MD (US) 20878; Michael Ohadi, 13810 Lakeside Dr., Clarksville, MD (US) 21029

( * ) Notice: Subject to any disclaimer, the term of this patent is extended or adjusted under 35 U.S.C. 154(b) by 0 days.

(21) Appl. No.: 10/832,895

(22) Filed: Apr. 27, 2004

Related U.S. Application Data

(60) Provisional application No. 60/466,988, filed on May 1, 2003.

(51) Int. Cl.
*H05K 7/20* (2006.01)
*H01L 23/34* (2006.01)
*F28F 7/00* (2006.01)

(52) U.S. Cl. ............... 361/699; 361/706; 361/707; 361/705; 361/708; 257/706; 257/707; 257/712; 257/713; 165/80.3; 165/185; 174/15.1; 174/252

(58) Field of Classification Search .......... 361/699
See application file for complete search history.

(56) References Cited

U.S. PATENT DOCUMENTS

| | | | |
|---|---|---|---|
| 4,072,188 A * | 2/1978 | Wilson et al. ......... 165/80.4 |
| 4,730,665 A * | 3/1988 | Cutchaw ............ 165/80.4 |
| 4,765,400 A * | 8/1988 | Chu et al. ............ 165/185 |
| 4,918,571 A * | 4/1990 | Grabbe ............... 361/718 |
| 5,008,737 A | 4/1991 | Burnham et al. | |
| 5,130,771 A | 7/1992 | Burnham et al. | |
| 5,786,075 A * | 7/1998 | Mishuku et al. ....... 428/325 |
| 5,915,463 A * | 6/1999 | Romero et al. ....... 165/80.3 |
| 6,016,007 A * | 1/2000 | Sanger et al. ........ 257/714 |
| 6,060,795 A * | 5/2000 | Azotea et al. ......... 307/150 |
| 6,101,715 A * | 8/2000 | Fuesser et al. ...... 29/890.03 |
| 6,114,048 A * | 9/2000 | Jech et al. .......... 428/547 |
| 6,179,886 B1 | 1/2001 | Gordeev et al. | |
| 6,270,848 B1 | 8/2001 | Nishibayashi | |
| 6,473,303 B2 * | 10/2002 | Kaufmann ............ 361/699 |
| 6,535,388 B1 * | 3/2003 | Garcia ................ 361/704 |
| 6,578,626 B1 * | 6/2003 | Calaman et al. ....... 165/80.4 |
| 6,719,039 B2 * | 4/2004 | Calaman et al. ....... 165/80.4 |
| 6,729,383 B1 * | 5/2004 | Cannell et al. ........ 165/80.3 |
| 6,745,823 B2 * | 6/2004 | Brost ................. 165/80.4 |
| 6,845,812 B2 * | 1/2005 | Turocy et al. ......... 165/80.3 |

* cited by examiner

*Primary Examiner*—Boris Chervinsky
*Assistant Examiner*—Zachary Pape
(74) *Attorney, Agent, or Firm*—Rosenberg, Klein & Lee

(57) ABSTRACT

A liquid cooled heat sink for cooling integrated and power modules. The heat sink is formed of a Diamond, Silicon Carbide composite and is provided with heat transfer facilitating fins and an enclosure for routing the cooling liquid into heat transfer contact with the heat sink and its fins.

9 Claims, 4 Drawing Sheets

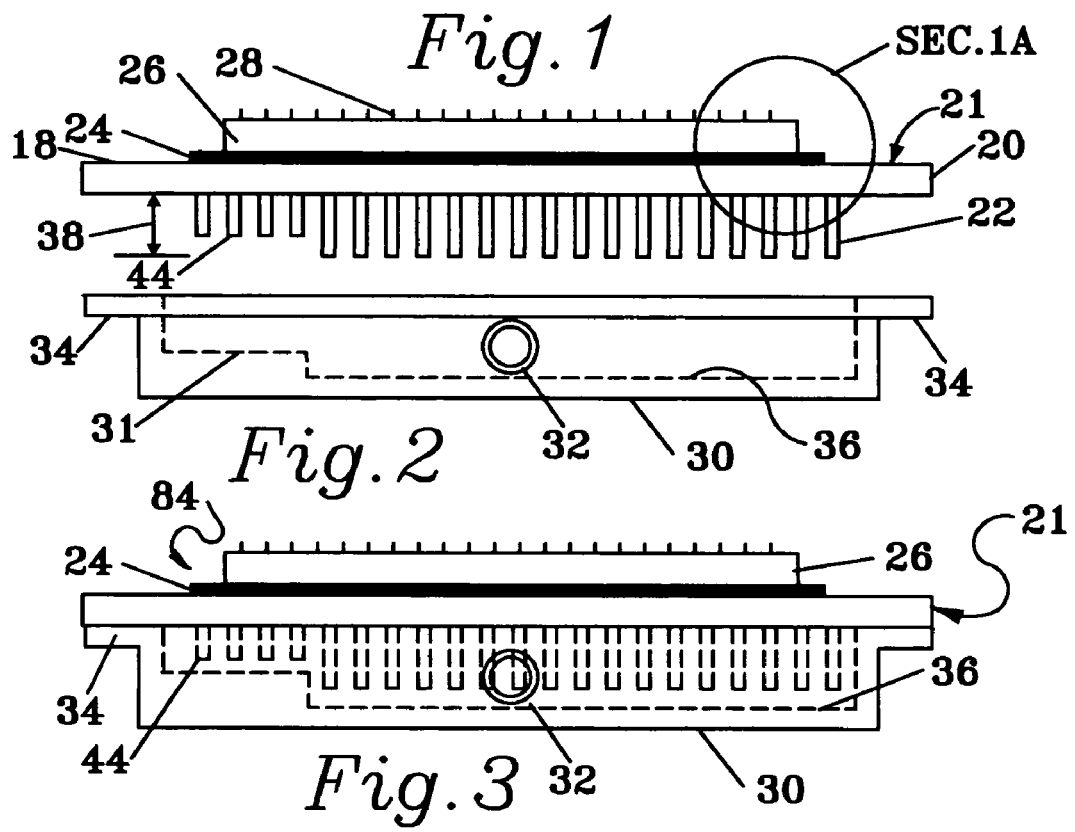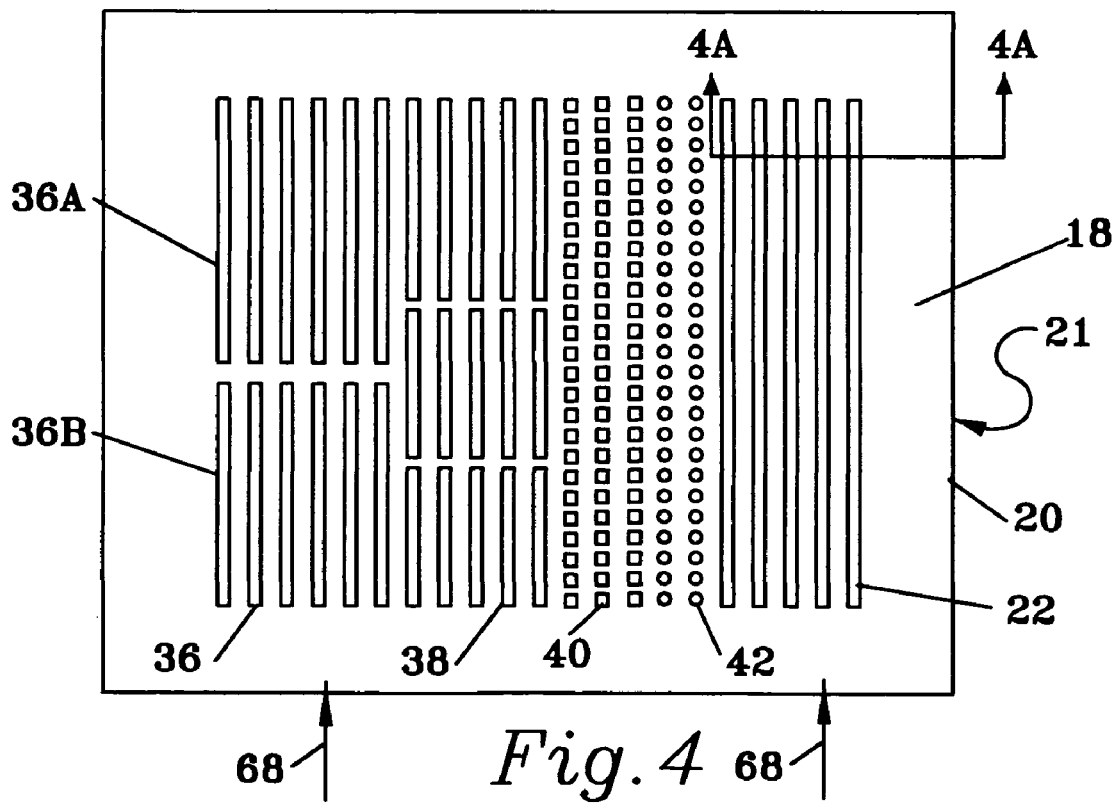

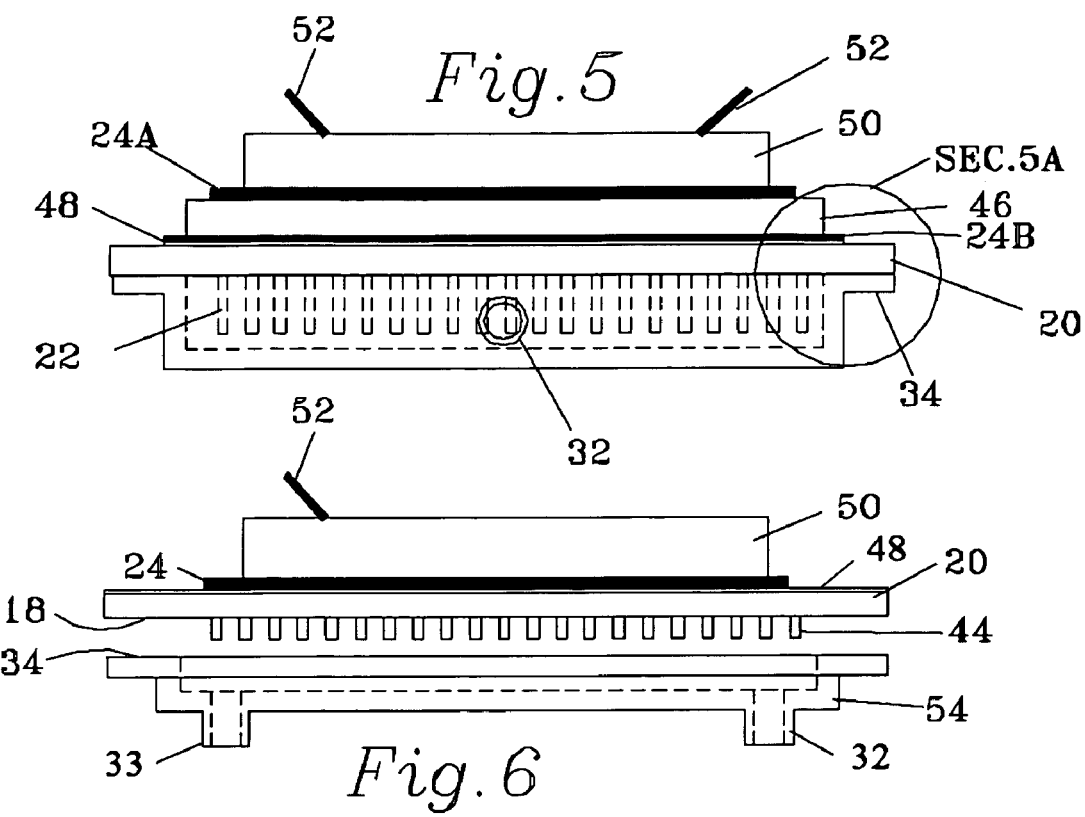
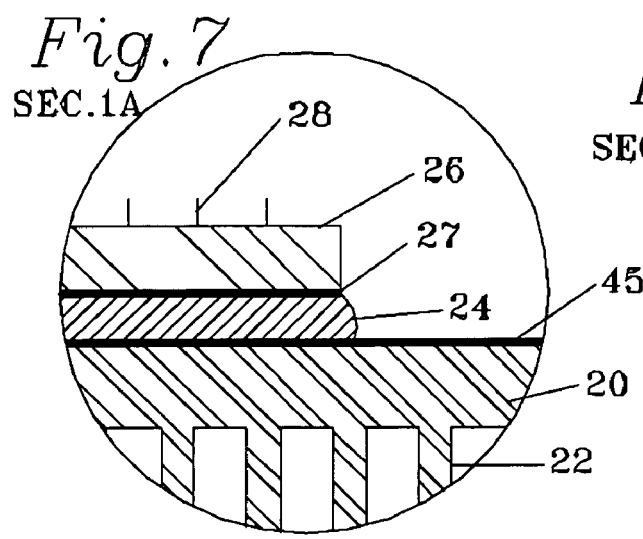

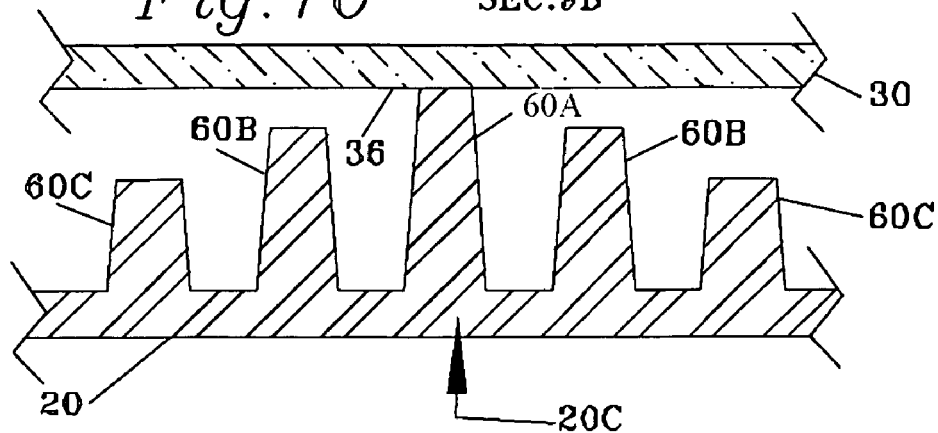
*Fig. 10* SEC.9B
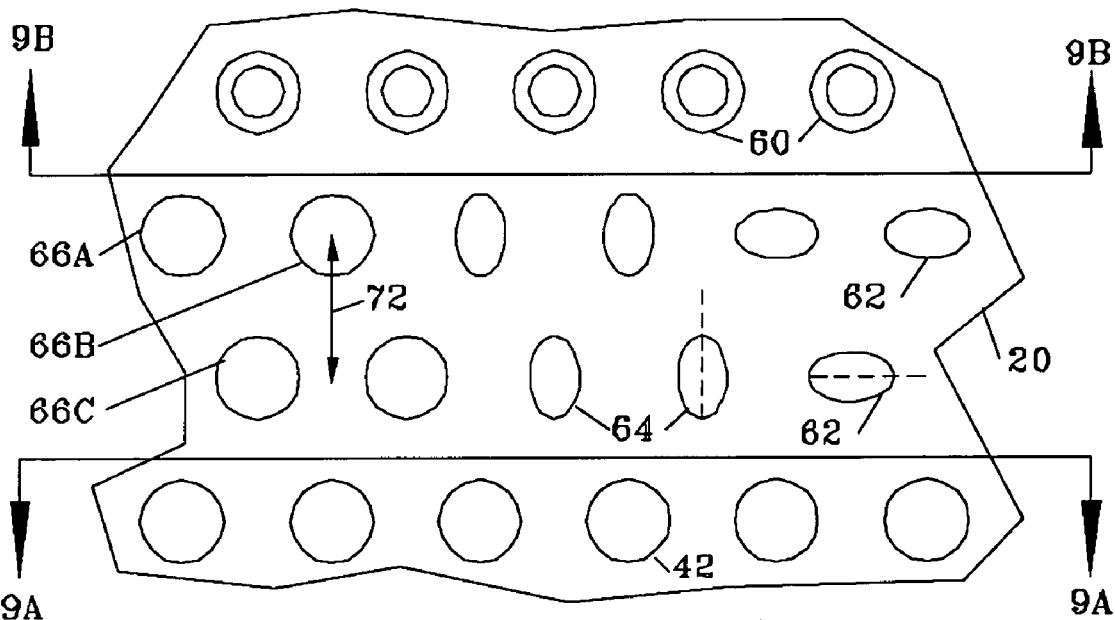
*Fig. 9*
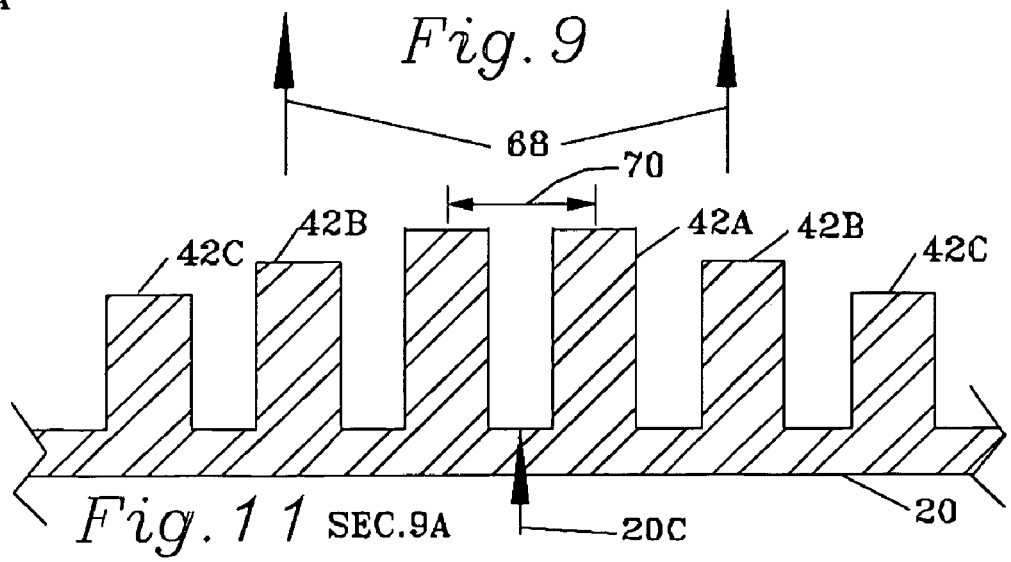
*Fig. 11* SEC.9A

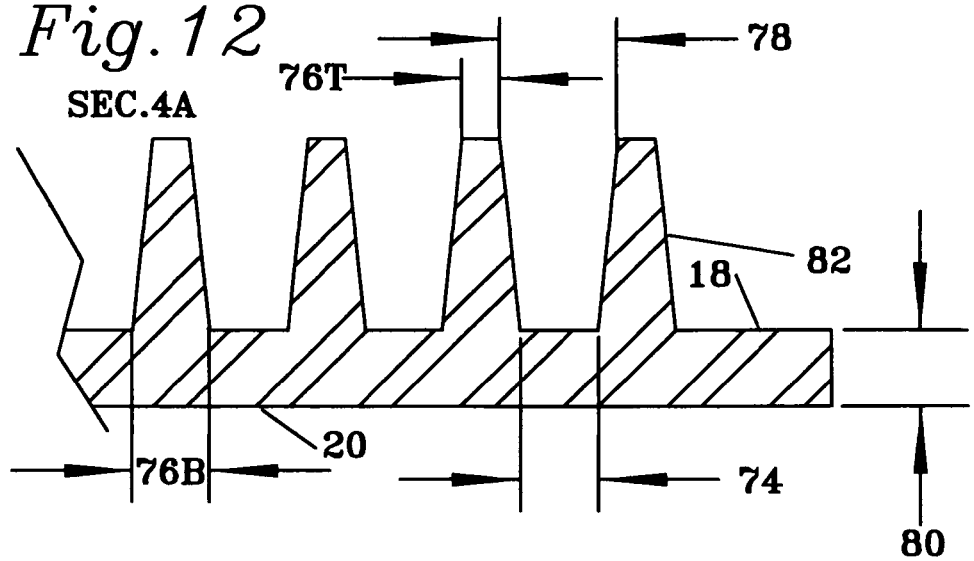
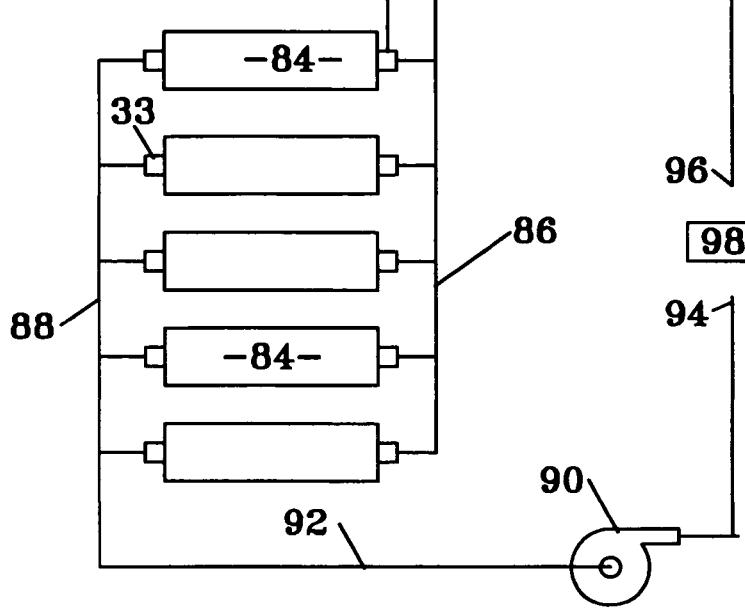
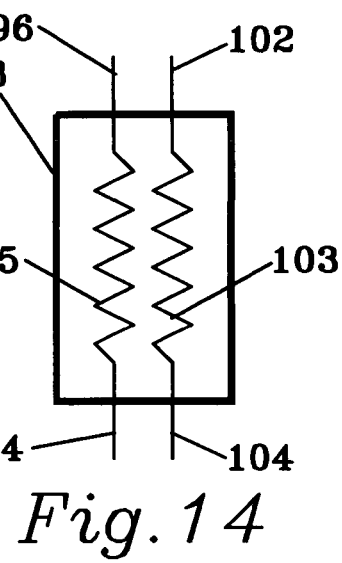

LIQUID COOLED DIAMOND BEARING HEAT SINK

CROSS REFERENCE TO RELATED APPLICATIONS

Applicants claim priority of a Provisional Patent Application dated 1 May 2003 (May 1, 2003) having Ser. No. 60/466,988.

FEDERALLY SPONSORED RESEARCH

This invention was made with Government support under grant N00014-01-C-0418 awarded by the Office of Naval Research. The Government has certain rights in the invention.

BACKGROUND

1. Field of the Invention

The invention is directed to apparatus for more effectively cooling electronic or micro-electronic devices that emit large quantities of waste heat over very small areas and that are extremely sensitive to damage or non-operation under conditions of high operating temperatures. The invention is further directed to such apparatus employing diamond bearing particles in a construction to convey heat from such emitters to a cooling liquid such as air or water.

2. Prior Art

Nishibayashi U.S. Pat. No. 6,270,848 teaches the use of a matrix formed of diamond and metal carbide particles but with a metallic metal filling for the matrix as a thermal conductor for cooling a semiconductor heat source. There is no reference to liquid cooling or to any special fin design.

Burnham et al U.S. Pat. Nos. 5,130,771 and 5,008,737 teaches only the use of diamond particles embedded in a metal matrix for cooling a light emitting semiconductor. There is no reference to silicon carbide as an important second component or to liquid cooling.

Gordeev, et al, U.S. Pat. No. 6,179,886 teaches only the use of diamond in a silicon carbide/silicon matrix as an intermediate in the formation of abrasive grains.

BACKGROUND OF THE INVENTION

Integrated circuits (IC) utilize micro-components such as transistors, capacitors and resistors that use and control electrical energy, frequently in digital form for controllers and computers. Larger macro sized solid state components are employed as power controllers such as switches, rectifiers, and alternators. Neither the micro nor the macro sized components or conductors are 100 percent efficient.

The micro-digital assemblies used in computers convert substantially all the electrical energy used in their computations into heat. While relatively small amounts of power are used, the micro-assemblies or integrated circuits (IC) are small so the quantity of heat to be dissipated per unit area is high, thereby generating an intense heat dissipation problem.

In the early versions of these integrated circuits having relatively few components per unit area, natural convection cooling proved adequate to limit the operating temperatures to safe values. As technology allowed packing more components into an integrated package the heat generated required motor driven fans mounted directly on the integrated circuit packages, thereby providing forced convection cooling, to control the package temperature. In order to accommodate higher and higher component densities and higher operating speeds requiring more and more power, more and more vigorous efforts have been made to remove heat effectively from the integrated circuit packages to keep the operating temperatures of the integrated circuit at safe levels.

These efforts include the use of more powerful fans, specialized venturis to direct the fan output onto the external surface of the integrated circuit package at higher velocities, plastic fins molded directly into the integrated circuit package and metal fins mounted on the package with heat conducting paste to better foster heat flow from the package to the fins to the fan forced air stream. All of these air cooled heat dissipation schemes are subject to reduced airflow caused by low voltages at the cooling fan/s and to total cooling failure caused by accumulation of insulating layers of airborne dust on the cooling fins and fan blades.

The increases in component density and accompanying heat dissipation rates have acted to raise operating temperatures of the IC packages to such levels that, with the best heat dissipating systems, their operating life can be endangered. To cope with this problem, temperature sensing thermistors have been placed in the micro-circuits to reduce their performance and thereby their heat dissipation and temperature under high ambient conditions or when the heat dissipating mechanisms lose efficacy, as when fouled with room dust. These mechanisms keep the computer operating but at reduced capability. This may be tolerable in household computing situations, but is intolerable in military or commercial systems where human lives and great fortunes can be endangered.

Server systems have great numbers of information handling integrated circuits, the problem of disposing of the heat generated by these devices becomes severe. The heat must be removed by air-conditioning systems. The systems must be specially designed with underfloor ducts or other means to reliably direct the cool air to the hot devices. Reliable means must be provided to remove the heated air, having been used for cooling, back to the air conditioner.

Power systems frequently operate at voltages in excess of 1000V. These units provide electrical control and conversion of large flows of electricity. The high voltages applied to these units require special insulating measures to avoid electrical leakage to adjacent conductive elements or to electrically conductive coolants such as aqueous brines or water.

The current invention is directed to means for sharply improving the cooling effect available to these circuit elements and microcircuits so that greater loads can be handled and greater component densities can be employed without the risk of the circuit element operating temperatures rising near their failure temperature.

Low Resistance to Heat Flow: The most effective cooing occurs when there is a path of low resistance for heat flow between the coolant and the hot object. There are at least two components to the heat resistance between the cooling fluid and the hot object: These heat flow resistances are additive. First is the heat flow resistance of the element or device that communicates the waste heat between the hot object and the cooling fluid. Second is the resistance to heat flow between the cooling fluid and the heat transfer element. The numerical value of the heat flow resistance is the reciprocal of the numerical value of the heat transfer coefficient expressed as heat flow/unit area-degree temperature or Btu/hr-ft$^2$-deg.F or Watts/cm$^2$-deg.C Fluid Heat Transfer Coefficient: Even if the temperature of room air were tolerable for the purpose of cooling high power electronic element, air is characterized by a notoriously low heat transfer (film) coefficient, typically in the range from 2–12 Btu/hr-ft²-F (12–68 W/m²-K) (high resistance). By contrast, liquids such as water or alcohol can exhibit heat transfer coefficients in the range of 25–100 Btu/hr-ft²-F (142–567 W/m²-K) (low resistance).

Further, the use of liquids for cooling allows small flexible tubes to convey the cooling liquid to and away from the hot devices with minimum effect on the ambient. This allows much smaller air conditioning systems with much simpler ductwork required. Cool water from the cooling tower used for the air conditioner can be used to remove heat from the cooling liquids via a heat exchanger without any extra air-conditioning equipment or power.

Heat Transfer Element: The resistance to heat flow of the heat transfer element acting between the cooling fluid and the heated object is a function both of its material and its design. Extended surfaces formed in the heat transfer element act to increase heat transfer surface area, fluid velocity and turbulence, thereby reducing resistance to heat flow

OBJECTS AND ADVANTAGES

It is an object of the invention to provide means and methods for more effectively cooling a high intensity heat source.

It is a further object to provide such means that including a liquid flow and means for placing the liquid flow in effective thermal contact with the heat source.

It is a further object to provide such means that include a diamond bearing thermal link, including a base, between the liquid and the heat source.

It is a further object to provide a diamond bearing thermal link having a Coefficient of Thermal Expansion (CTE) selected to closely match the CTE of the heat source.

It is a further object to provide such a heat sink whose CTE is between 90 percent and 110 percent of the CTE of the heat source.

It is a further object to include such a thermal link having a composition including diamond and silicon carbide.

It is a further object to provide such a link including a cover having a liquid inlet and liquid outlet positioned to channel liquid in a direction in contact with the thermal link base.

It is a further object to provide such a link having one or more longitudinal fins formed integral with the base of the diamond link and positioned so that the direction of the fins is the same as the flow direction of the liquid.

It is a further object to provide such a link having pins formed integral with the diamond link base.

It is further object to provide such a link where the pins are tapered and the wider portions are integral with the base.

It is a further object to provide such a link where the pin positions are staggered with respect to the flow direction.

It is a further object to provide such a link where the pin positions are in-line with respect to the flow direction.

It is a further object to provide such means including means for cooling the liquid that has traversed the link.

It is a further object to provide a liquid circuit, including cooling means for the coolant, whereby liquid having traversed the heat sink and been heated, traverses the cooling means, is cooled therein and returned to the heat sink as cooled liquid.

Other objects will become apparent from the textual descriptions and drawings.

SUMMARY OF THE INVENTION

Means for cooling a heat source having a Coefficient of Thermal Expansion (CTE), said heat source having a surface intended to be cooled, said cooling means comprising a structure formed of a combination of Diamond particles and silicon carbide, said combination being selected to have a CTE matching the CTE of the heat source, the structure having a first side formed to closely fit the heat source surface and a second side formed with a shape to effectively transfer heat to a flowing liquid, said liquid flow having a flow direction, said shape being selected from the group consisting of planar, cylindrical pins, conical pins, elliptical pins having a major axis perpendicular to the flow direction and elliptical pins having a major axis parallel to the flow direction.

BRIEF DESCRIPTION OF THE DRAWINGS

FIG. 1 displays the heat transfer element of the invention coupled to a low power heat source via a solder connection.

FIG. 2 shows the plastic cap formed to mater with the heat transfer element to allow liquid coolant to be used.

FIG. 3 shows the elements of FIGS. 1 and two in operating relationship.

FIG. 4 is a plan view of the liquid contact side of the heat transfer element showing five different kinds of fins among those applicable to the invention.

FIG. 5 is a side elevation showing a prior art construction between the heat source and the heat sink of the invention.

FIG. 6 is like FIGS. 1 and 2 except provided with short fins for accommodating lower power integrated circuits and with a thin electrically insulating deposit positioned between the heat source and the heat sink.

FIGS. 7 and 8 are sections of FIGS. 1 and 5 showing details of construction.

FIG. 9 is a plan view of a high conductivity base of the invention showing a variety of fins of the pin-type.

FIG. 10 is a crossection of a portion of FIG. 9 showing tapered pins.

FIG. 11 is a similar crossection of FIG. 10 showing non-tapered cylindrical pins.

FIG. 12 is section 4A of FIG. 4 showing approximate shape of one kind of longitudinal fins.

FIG. 13 illustrates one arrangement for supplying cool liquid to the heat sinks and for removing heated coolant.

FIG. 14 illustrates a heat exchanger for cooling the heated coolant.

DETAILED DESCRIPTION OF THE INVENTION

Background

There are at least two problems that are encountered when conceiving of a heat transfer material for thermal connection to a high or low power integrated circuit (IC). That is, the material must have high thermal conductivity and must also have a Coefficient of Thermal Expansion (CTE) that is very close to the CTE of the material on which the integrated circuit is formed. Prior cooling means for ICs employed materials having CTEs much different than that of the IC. This required that thermal links be provided that allowed the two entities, the IC heat source and the cooling means, to expand substantially independently. Such links always decreased the compactness of the assembly and increased the resistance to heat flow as exemplified by the construction of FIG. 5.

Silicon is a commonly employed material on which integrated circuits (IC) are formed has a CTE of about 4 parts per million per degree C. (ppm/C) By contrast, copper has a CTE of about 17. Therefore, when the silicon base of the IC is uniformly attached, as by soldering, to the copper at one temperature, any substantial temperature change introduces thermal stresses which imperil both the joint between the two and the integrity of the IC itself. For this reason, a copper layer positioned intermediate the heat generating module and the diamond heat sink is only permissible when the power module itself has relatively low power output, thereby limiting the temperature differences between the elements.

Compositions best suiting the purposes of the invention have CTEs within a range of 90 percent and 110 percent of the CTE of the heat source. Typically, such an agreement can be secured with a heat sink having a range of diamond concentrations from 30 to 70 percent in a silicon carbide matrix. Such heat sinks will have CTE's comparable to that exhibited by most power modules and therefore will be applicable to the purposes of the invention. However, preferred compositions between 55 and 65 percent diamond powder with the remainder primarily silicon carbide have CTE's close to that of the compositions that are commonly employed as bases for integrated circuits and power modules. Within these ranges, heat sink compositions having CTEs in the range of 90 percent to 110 percent of the CTE of the heat source can be selected. Small amounts of additional constituents such as silicon metal, copper or even silver may be useful for the purpose of more closely matching CTEs. One process for the formation of the matrix from the powders includes very high pressure molding of the powders into the desired form and subsequent baking via a vacuum sintering process. The vacuum sintering is carried out at temperatures in the range of 800° C. to 1200° C. depending on the physical characteristics required. The resulting product has electrical conductivity comparable to semiconductors. That is, low enough to be employed with loq voltage heat sources but requiring additional electrical insulation for use with higher voltage power modules. The product is very hard. If the dimensions after sintering are not sufficiently precise, the product must be formed by diamond grinding or laser machining.

Referring now to FIGS. 1 and 4, there is shown in FIG. 1 a heat generating integrated circuit (IC) 26. IC 26 has pins 28 for transmitting digital information to a computer-like device and for receiving electrical power. In order to remove the heat generated by the module, substantial and effective cooling must be provided. The lower surface of IC 26, that is the side opposite the pins 28, is positioned to be attached to and thermally communicate with heat sink 21. The attachment method 24 is described in detail in connection with section 1A shown enlarged as FIG. 7.

In FIG. 1, heat sink 21 has base 20 and integral fins 22. Several designs of fins are best adapted to perform effective heat transfer under liquid flow conditions. FIG. 4 shows the gross form of some of the fins that are suitable for this application. In FIG. 4, there are full length fins 22 formed as parallel ribs rising out of and integral with base 20. This type of fin 22 is also shown in FIG. 1. Fins 22 have a height 38. Other types and details of fins are shown and described in FIGS. 9, 10, 11 and 12. In FIG. 4, there are shown five fin types formed integral with base 20. Fin 22 is a full length ribbed type. Typically it has a minimum thickness of about 0.5 mm and a height 38 between 2 and 4 mm. Each rib can be spaced as closely as 0.5 mm from its parallel neighbor. However, this close spacing must be secured with laser milling, an expensive procedure for small quantity production. Similar heat sinks with larger spaces between parallel ribs can be formed by molding.

Fin 36 is formed with an intermediate gap and thereby is divided into segments 36A and 36B. The gap between segment 36A and 36B provides added turbulence in liquid flowing along the fin, thereby improving heat transfer from the fin 36 and base 20 to the liquid. In like manner full length fin 22 is divided into three sections to form divided or segmented fins 38.

Since the greatest heat load is expected in the central portion of IC 26, highest rates of heat transfer would be required in the central portion of heat sink 21. Therefore, peripheral portions of heat sink 21 can be provided with shorter fins 44 or even no fins to reduce the mass of diamond/silicon carbide composition required.

Ultimately, longitudinal fins 22 are elongated pins. They can be divided into square pins 40 or into cylindrical pins 42. FIG. 9 shows these and other pin-type fins in more detail and these will be more fully described in connection therewith. The gap dimension is typically equal to the thickness of the rib but some experimentation may be required for the most efficient design. Section 4A of FIG. 4 is shown as FIG. 12 for the purpose of displaying dimensional details of an elongated bar-type pin 82, described also as a bar type fin 82 and discussed in connection therewith.

With respect to the design and spacing of the pin type heat transfer elements 40 and 42, typical dimensions are provided in connection with FIGS. 9, 10 and 11. However, the exact dimensions will vary with the type of cooling liquid and the thermal conductivity of the heat sink material.

Typically base 20 is square or rectangular and has a typical side dimension of about 50 mm and a thickness dependant on it size. A typical thickness for a 50 by 50 mm base 20 would be between 1 and 5 mm. However, the thickness would depend on the fin type. Since longitudinal fins contribute rigidity, a full length fin 22 could be made with a thickness between 1 and 2 mm. Further, the side length will be selected before manufacture to be larger than the dimensions of the IC 26 with which it to be associated so that the hot portion of IC 26 would be smaller than or correspond with the finned portion of heat sink 21 and so there is a flange 18 to mate with and seal to cap flange 34 whereby the cooling fluid can flow across the heat sink 21 without leakage.

Section 1A of FIG. 1 is shown enlarged as FIG. 7 for the purpose of showing the details of the solder joint 24. Since IC 26 is inherently a low voltage assembly normally operating in the voltage range of 5 to 12 volts, the electrical insulating effect of the IC 26 is sufficiently effective to allow it to be directly soldered to the flange portion 20 of the heat sink 21. In FIG. 7, both IC 26 and base 20 of the heat sink have been prepared with metalized layers. IC 26 can be metalized with a typical tinning process employing a non-corrosive flux to form tinned layer 27. Base 20 of the heat sink must be coated with a solderable layer 45 of tin or copper, for instance. These can be applied to the diamond-based heat sink by electroplating or vacuum metalizing. The two solderable layers are then joined with ordinary electrical soft solder, employing a non-corrosive flux, if necessary.

In FIG. 2 there is shown a cap 30 formed with flange 34 to mate with and form a leak-tight connection with the flange portion 18 of base 20 of heat sink 21. While no particular sealing method is shown, an epoxy cement/sealant would be employed. In the alternative a gasket positioned between flange 18 and flange 34 with clamp or screw means for holding the two flanges tightly against the gasket could be employed.

Cap 30 has an inside surface 31 shaped to fit more or less closely to the tips of the fins 22, 44, etc. The elevation change of inside surface 31 is coincident with the change in fin height from higher fin 22 to shorted fin 44. The actual gap between the tops of the fins and inside cap surface 31 depends on fin design and spacing. For instance, if only pin-type fins are employed, the surface 36 may be fitted closely to the fin tips. If only bar-type fins are employed, a gap between the inside cap surface 31 and the fin tips may be required for effective liquid circulation. The size of the gap would be subject to experimentation. Cap 30 has a liquid inlet 32 and a liquid outlet 33. The liquid outlet 33 is not shown here but is shown in FIG. 13, positioned opposite inlet 32.

FIG. 3 shows a complete assembly 84 having flange 34 of the cap mated with flange 18 of base 20 of the heat sink.

FIG. 5 shows a complete heat sink assembly including heat sink 20 and flow cap 30 with liquid inlet 32. Power module 50 having power leads 52 is attached to copper heat distribution block 46 by solder 24A. Both the copper and the power module surfaces must be tinned before soldering as described in conjunction with FIG. 7. Typically a low melting 50—50 lead-tin solder is employed though other solders such as 95-5 tin antimony may also be suitable. The details of fastening the copper disc to the electrically conducting heat sink are shown enlarged in section 5A (FIG. 8).

FIG. 8 (section 5A) shows more clearly the copper disc 46, the electrically insulating layer 48 and the solder layer. The copper disc 46 is tinned then soldered (solder layer 24B) to a thin vacuum deposited electrically insulating layer 48 of diamond, aluminum nitride or alumina (aluminum oxide) that has been plated onto the base 20 of the heat sink. Before soldering this electrically insulating layer must be itself coated with a metallic or solderable layer 49 (tinned). Thereafter, the soldering technique is the same as that described in connection with FIG. 7 where the surfaces to be soldered must also be 'tinned' prior to soldering. While copper heat distribution disc 46 is shown, a preferred construction is like that shown in FIG. 6 where the power module is mounted directly to heat sink 20 through the electrical insulating layer 48. Layer 48 is typically a thin pure diamond or ceramic layer having high electrical resistivity and high breakdown potential that is formed by a plasma enhanced chemical vapor deposition (CVD) process. Thermally enhanced CVD processes are also suitable depending on the desired thickness and deposition rate.

FIGS. 9, 10 and 11 are all directed to various types of pin-type heat transfer elements formed integral with and of the same material as diamond composite base 20. Directing attention to FIG. 9 there is shown a plan view of a portion of base 20 having various types of fins. There are tapered pins 60A, 60B and 60C of varying heights, cylindrical pins 42A, 42B and 42C of varying heights, elliptical or oval pins 62 and 64 all positioned on staggered or triangular centers 72. Gross flow direction 68 of liquid coolant through the pin type heat transfer elements is shown by flow arrows 68. The gross flow direction is the overall direction of liquid flow through the pins. It must be recognized that the direction of any particular particle of liquid will vary as the liquid flows along and around each pin.

Elliptical pins 62 have their major or long axis perpendicular to the gross flow direction 68. Elliptical pins 64 have their major or log axis positioned substantially parallel to the gross flow direction 68. The selection of pin type and orientation and spacing can be determined experimentally or by computer simulation to secure the most efficient cooling with the smallest mass of the heat sink material.

While bar type fins (pins) such as 22, 38 and 36 must always be positioned with the gross liquid flow direction along the length of the longitudinal fins, short pin type fins 60, 62, 64, 66 and 42 can be arranged in-line or staggered modes. An example of in-line pin arrangement is shown in FIG. 4 with especial reference to pin type fins 40 and 42. Staggered pin arrangement is displayed by the pins in FIG. 9. Pins 66 have a row to row spacing 72. The centers of the pins in row 66A are offset to a position approximately midway between the centers of the pins in the adjacent rows 66B and 66C thereby securing a staggered pin arrangement.

Section 9A—9A has been provided as FIG. 11 to demonstrate the cylindrical shape and pin to pin spacing 70 between the pins in each row. Section 9A also displays a center point 20C of base 20 and fin heights 42A, 42B and 42C varying functionally with their distance from the center 20C, the position of most intense heat transfer. Section 9B—9B, shown as FIG. 10 has been provided to illustrate the tapered shape of the pins 60 and also to show an example of an inner portion 36 of cap enclosure 30 positioned directly against and substantially in contact with the tips of tapered pins 60. A center point 20C of base 20 is shown and reduced fin heights 60B and 60C as their distance from the base center is increased. Typically the spacing 72 (FIG. 9) between rows is 0.5 to 1.0 mm. The gap 74 between pins at the base is 2 to 4 mm.

In FIG. 12 there is shown section 4A—4A of FIG. 4 for the purpose of better defining one shape of longitudinal fins 42. In FIG. 12 the fins labeled as 42 in FIG. 4 are shown to have a tip width about 76 T about 0.5 mm and a base width 76 B about 1 mm though these can be adjusted by the designer to accommodate different heat loads and liquid coolant flow rates as well as the physical limitations of the material and forming process. The gap 74 between the rows at the base between 0.2 and 0.5 mm. The thickness of the base 20 depends on the area of the base but for a heat sink having bar-type fins and having an over all dimension of 5 mm by 5 mm as thickness of about 1 mm would be appropriate. Pin-type fins of the same overall dimensions would require a thicker base 20.

In FIG. 13 there is shown a grouping of five individual heat sink assemblies as shown in FIG. 3. Each assembly is identified as 84 and has a liquid inlet 32 and liquid outlet 33. The five liquid inlets 32 are joined by inlet manifold 86. The five liquid outlets are joined by outlet manifold 88. Outlet manifold 88 delivers the liquid coolant warmed by its traverse through the heat sink assemblies 84 to conduit 92 that connects to the inlet of pump 90. Pump 90 circulates the liquid coolant to a cooling means 98 via conduit outlet 94. The liquid having been cooled by cooling means 98 is returned to conduit inlet 96 and returned for further cooling effect to inlet manifold 86 from which the cooling cycle is repeated.

The liquid cooling means 98 may be in the form of a cooling tower, a liquid to air heat exchanger or a liquid-to-liquid heat exchanger. Such a liquid-to-liquid heat exchanger 98 is shown as FIG. 14. Cooling heat exchanger 98 has cooling coil 95 in thermal exchanger with coil 103. Cooling coil 95 has inlet 94 corresponding to connection to pipe outlet 94 of FIG. 13 and outlet 96 corresponding to conduit inlet 96 of FIG. 13. Cooling coil inlet 102 and outlet 104 of heat exchanger 103 is connected to a refrigerating system. The refrigerant may act directly on coil 103 or through an intermediate cooling medium such as brine or water. In other applications the heat exchanger 98 may be employed to preheat water for domestic hot water use or may instead be cooled by cold water from a deep lake bottom.

From the foregoing description, it can be seen that the present invention comprises an improved composition and construction for designing a liquid cooled heat sink for cooling an integrated circuit or other small heat dissipating devices. It will be appreciated by those skilled in the art that changes could be made to the embodiments described in the foregoing description without departing from the broad inventive concept thereof. It is understood, therefore, that this invention is not limited to the particular embodiment or embodiments disclosed, but is intended to cover all modifications which are within the scope and spirit of the invention as described above.

We claim:

1. An apparatus for cooling a heat-generating device comprising:
   a heat sink formed from diamond-silicon carbide, said diamond-silicon carbide having a diamond concentration of between 30 percent and 70 percent, said heat sink including a base having a plurality of heat transfer enhancing elements protruding from a surface thereof in accordance with a spatial distribution, said heat transfer enhancing elements integrally formed from said diamond-silicon carbide in single piece formation with said base, said heat sink having a diamond coating on a surface of said base opposite said surface having said heat transfer enhancing elements, the heat-generating device being mounted to said surface of said base opposite said surface having said heat transfer enhancing elements;
   a cap coupled liquid-tight to said base of said heat sink so as to enclose said heat transfer enhancing elements therein, said cap having a liquid inlet and a liquid outlet formed thereon; and
   a cooling liquid flowing through said cap and in heat transport relation with said heat transfer enhancing elements so as to dissipate heat generated by the heat-generating device.

2. The apparatus as recited in claim 1, wherein said distribution of said heat transfer enhancing elements includes heat transfer enhancing elements that protrude further from a region of said base of said heat sink than heat transfer enhancing elements in another region of said base.

3. The apparatus recited in claim 2, wherein said region having said further protruding heat transfer enhancing elements is a central position of said base and said other region of said base is a non-central position thereof.

4. The apparatus recited in claim 3, wherein said heat transfer enhancing elements include elongated fins.

5. The apparatus recited in claim 3, wherein said heat transfer enhancing elements include cylindrical pins.

6. The apparatus recited in claim 5, wherein each of said cylindrical pins has an elongated cross-section.

7. The apparatus as recited in claim 5, wherein said pins have a base proximal to said surface of said base of said heat sink and a distal tip, where a cross-section of said base of each pin is larger than a cross-section of said tip thereof.

8. The apparatus recited in claim 6, wherein said elongated cross-section of each of said cylindrical pins is aligned with said flow of said liquid.

9. The apparatus recited in claim 6, wherein said elongated cross-section of each of said cylindrical pins is aligned perpendicular to said flow of said liquid.

* * * * *